United States Patent [19]
Obara

[11] Patent Number: 5,648,931
[45] Date of Patent: Jul. 15, 1997

[54] HIGH SPEED SYNCHRONOUS LOGIC DATA LATCH APPARATUS

[75] Inventor: Takashi Obara, Tokyo, Japan

[73] Assignee: NEC Corporation, Tokyo, Japan

[21] Appl. No.: 494,998

[22] Filed: Jun. 27, 1995

[30] Foreign Application Priority Data

Jun. 27, 1994 [JP] Japan .................. 6-165813

[51] Int. Cl.⁶ .................................. G11C 7/00
[52] U.S. Cl. .............. 365/189.05; 365/194; 365/233
[58] Field of Search ...................... 365/189.05, 191, 365/194, 233, 193, 230.06, 230.08

[56] References Cited

U.S. PATENT DOCUMENTS

| | | |
|---|---|---|
| 3,783,254 | 1/1974 | Eichelberger . |
| 5,295,115 | 3/1994 | Furuya ............... 365/230.06 |
| 5,426,606 | 6/1995 | Takai ................. 365/189.05 |
| 5,444,667 | 8/1995 | Obara ................. 365/233 |

FOREIGN PATENT DOCUMENTS

| | | |
|---|---|---|
| 0541840 | 5/1993 | European Pat. Off. . |
| 0548894 | 6/1993 | European Pat. Off. . |
| 0552046 | 7/1993 | European Pat. Off. . |
| 2-203611 | 8/1990 | Japan . |

*Primary Examiner*—David C. Nelms
*Assistant Examiner*—Son Mai
*Attorney, Agent, or Firm*—Sughrue, Mion, Zinn, Macpeak & Seas

[57] ABSTRACT

In a logic data latch apparatus including a clock signal input circuit for receiving a clock signal and at least two logic signal input circuits for receiving logic signals, a logic circuit is connected to the logic signal input circuits so that a logic operation is performed upon the logic signals. An output signal of the logic circuit is latched in a latch circuit in synchronization with the clock signal.

17 Claims, 20 Drawing Sheets

PRIOR ART
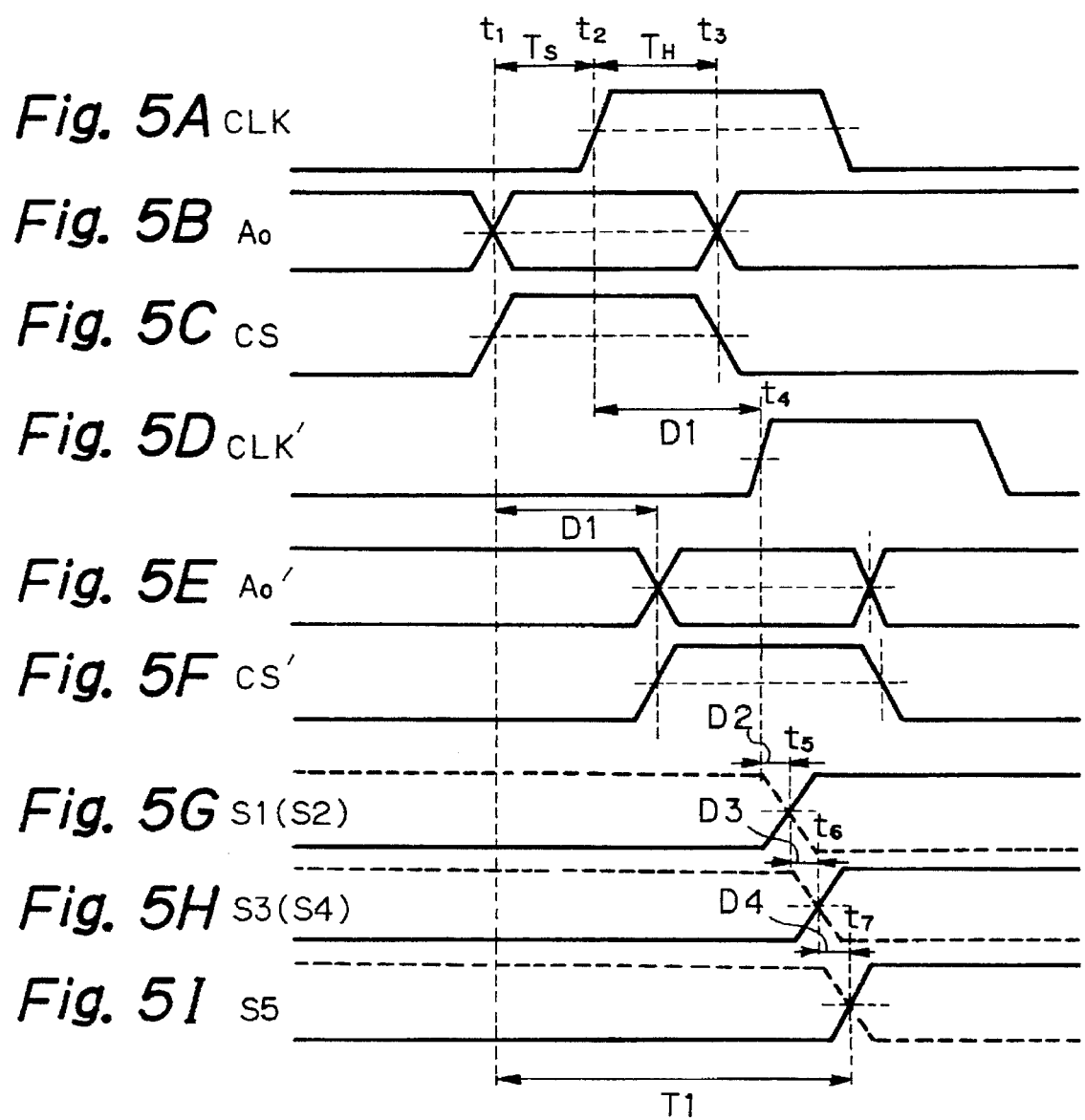

HIGH SPEED SYNCHRONOUS LOGIC DATA LATCH APPARATUS

BACKGROUND OF THE INVENTION

1. Field of the Invention

The present invention relates to a synchronous logic data latch apparatus, which can be incorporated in a synchronous semiconductor memory device (DRAM).

2. Description of the Related Art

In a prior art logic data latch apparatus which is used in a synchronous DRAM, logic signals or control signals such as a row address strobe signal RAS, a column address strobe signal CAS, a write enable signal WE and a chip select signal CS are latched in latch circuits in synchronization with a rising edge of a system clock signal from the exterior. In this case, a set up time $T_S$ of the logic signals with respect to the rinsing edge of the system clock signal is on the order of nano seconds, and a hold time $T_H$ of the logic signals with respect to the rising edge of the system clock signal is also on the order of nano seconds. In this case, the margin of the set up time $T_S$ and the margin of the hold time $T_H$ are small. Then, the output signals of the latch circuits are supplied to logic circuits which, in turn, generate various internal control signals. This will be explained later in detail.

In the above-described prior art logic data latch apparatus, however, use is not made of the set up time $T_S$. As a result, the transfer rate of data is decreased by the system clock signal. This decreases the access speed of the apparatus.

Also, in the above-described prior art apparatus, since there may be a skew between the output signals of the latch circuits, hazard (distortion errors) may be generated in the output signal of the logic circuit.

SUMMARY OF THE INVENTION

It is an object of the present invention to provide a high speed synchronous logic data latch apparatus.

Another object is to avoid the generation of hazard in the output signal of a logic circuit of the synchronous logic data latch apparatus.

According to the present invention, in a logic data latch apparatus including a clock signal input circuit for receiving a clock signal and at least two logic signal input circuits for receiving logic signals, a logic circuit is connected to the logic signal input circuits so that a logic operation is performed upon the logic signals. An output signal of the logic circuit is latched in a latch circuit in synchronization with the clock signal.

Also, delay lines can be inserted between the logic signal input circuits and the latch circuit instead of the logic circuit or in addition to the logic circuit.

Thus, a logic operation and/or a delay operation can be carried out within a set up time $T_S$ of the logic signals with respect to the clock signal. In other words, use is made of the set up time, so that the access speed can be increased. Also, when the logic circuit is connected directly to the logic signal input circuits, there may be no skew in the input signals of the logic circuit so that hazard can be avoided.

BRIEF DESCRIPTION OF THE DRAWINGS

The present invention will be more clearly understood from the description as set forth below, as compared with the prior art, with reference to the accompanying drawings, wherein:

FIGS. 5A through 5I are timing diagrams for showing the operation of the apparatus of FIG. 1;

DESCRIPTION OF THE PREFERRED EMBODIMENTS

Before the description of the preferred embodiments, prior art logic data latch apparatuses will be explained with reference to FIGS. 1, 2, 3, 4A through 4D, 5A through 5I, 6, and 7A through 7I.

Figure 1:
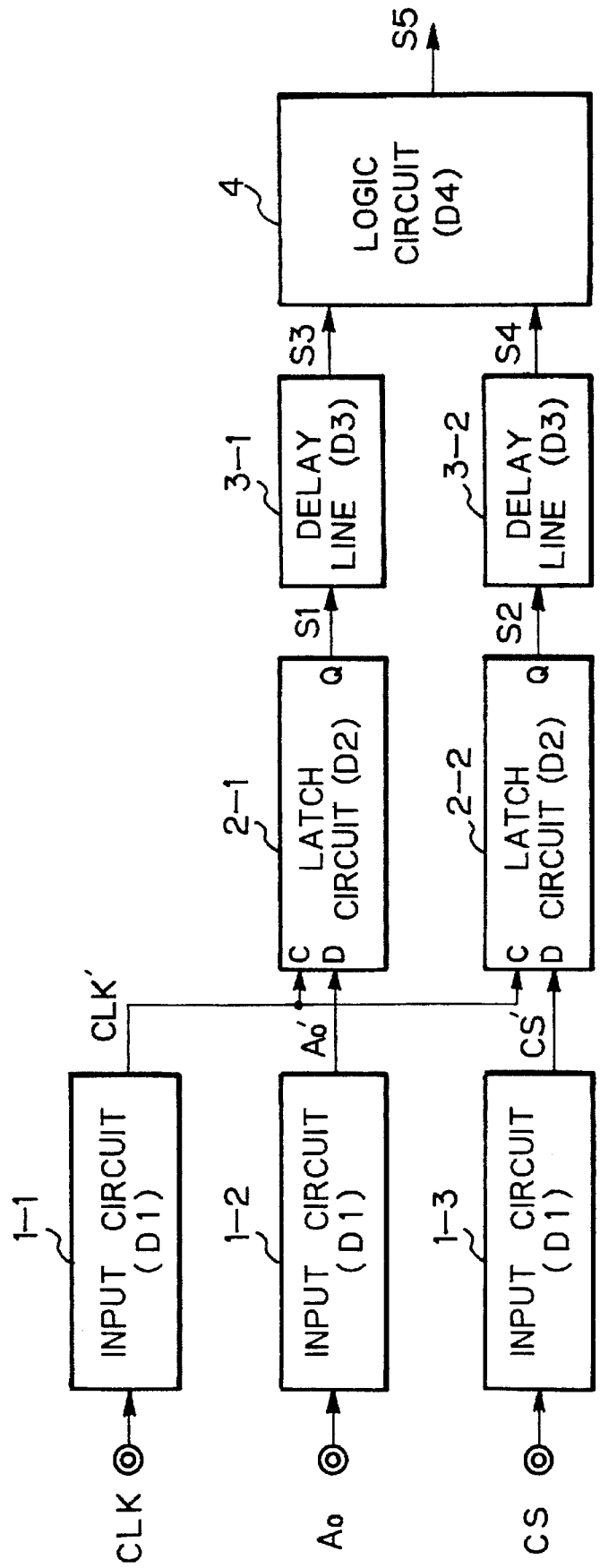
FIG. 1 is block circuit diagram illustrating a first prior art logic data latch apparatus.

In FIG. 1, which illustrates a first prior art logic data latch apparatus, reference numerals 1-1, 1-2 and 1-3 designate input circuits for receiving a system clock signal CLK, an address signal $A_o$ and a chip select signal CS. In this case, assume that delay times of the input circuits 1-1, 1-2 and 1-3 are the same and are defined by D1.

Output signals $A_o'$ and CS' of the input circuits 1-2 and 1-3 are supplied to latch circuits 2-1 and 2-2, respectively, and are latched in the latch circuits 2-1 and 2-2, respectively, in synchronization with a rising edge of a system clock signal CLK'. Also, in this case, assume that delay times of the latch circuits 2-1 and 2-2 are the same and are defined by D2.

Output signals S1 and S2 of the latch circuits 2-1 and 2-2 are supplied via delay lines 3-1 and 3-2, respectively, to a logic circuit 4. That is, the input circuits 1-1, 1-2 and 1-3 and the latch circuits 2-1 and 2-2 are arranged in the proximity of input pins, to thereby reduce the input capacity thereof. On the other hand, the logic circuit 4 is a long way from the pins. Therefore, the delay lines 3-1 and 3-2 are present between the latch circuits 2-1 and 2-2 and the logic circuit 4. Also, in this case, assume that delay times of the delay lines 3-1 and 3-2 are the same and are defined by D3.

The logic circuit 4 performs a logic operation upon output signals S3 and S4 of the delay lines 3-1 and 3-2, to generate an output signal S5. In this case, the delay time of the logic circuit 4 is defined by D4.

Figure 2:
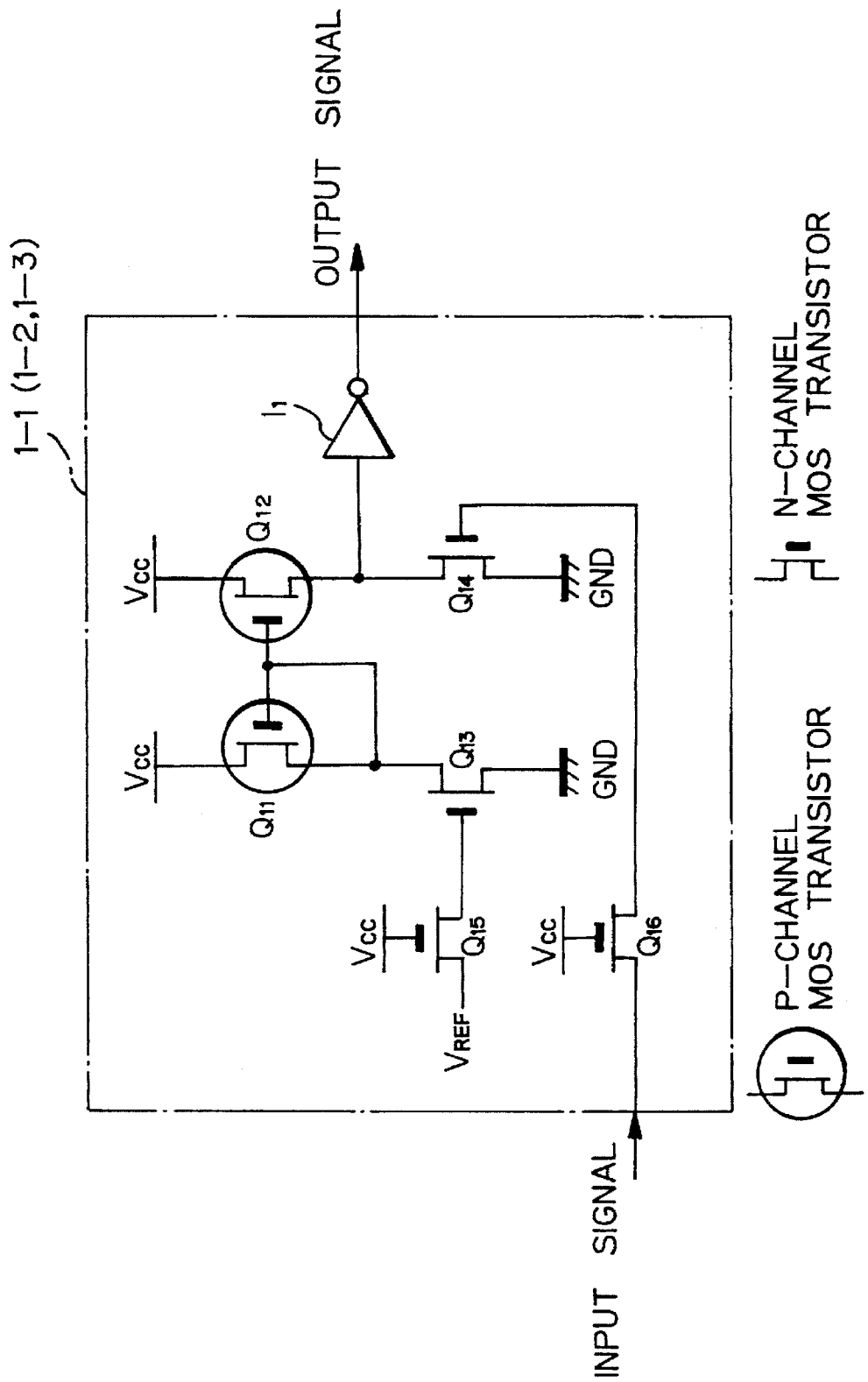
FIG. 2 is a circuit diagram of the signal input circuit of FIG. 1.

In FIG. 2, which is a circuit diagram of the input circuit 1-1 (1-2, 1-3) of FIG. 1, this input circuit includes P-channel MOS transistors $Q_{11}$ and $Q_{12}$ forming a current mirror circuit, and N-channel MOS transistors $Q_{13}$ and $Q_{14}$. Connected to gates of the transistors $Q_{13}$ and $Q_{14}$ are input N-channel MOS transistors $Q_{15}$ and $Q_{16}$ for receiving a reference voltage $V_{REF}$ and an input signal, respectively. Also, connected to a node between the transistors $Q_{12}$ and $Q_{14}$ is an inverter $I_1$ for generating an output signal. That is, when the voltage of the input signal is higher than $V_{REF}$, the voltage of the output signal is Vcc. When the voltage of the input signal is lower than $V_{REF}$, the voltage of the output signal is GND.

Figure 3:
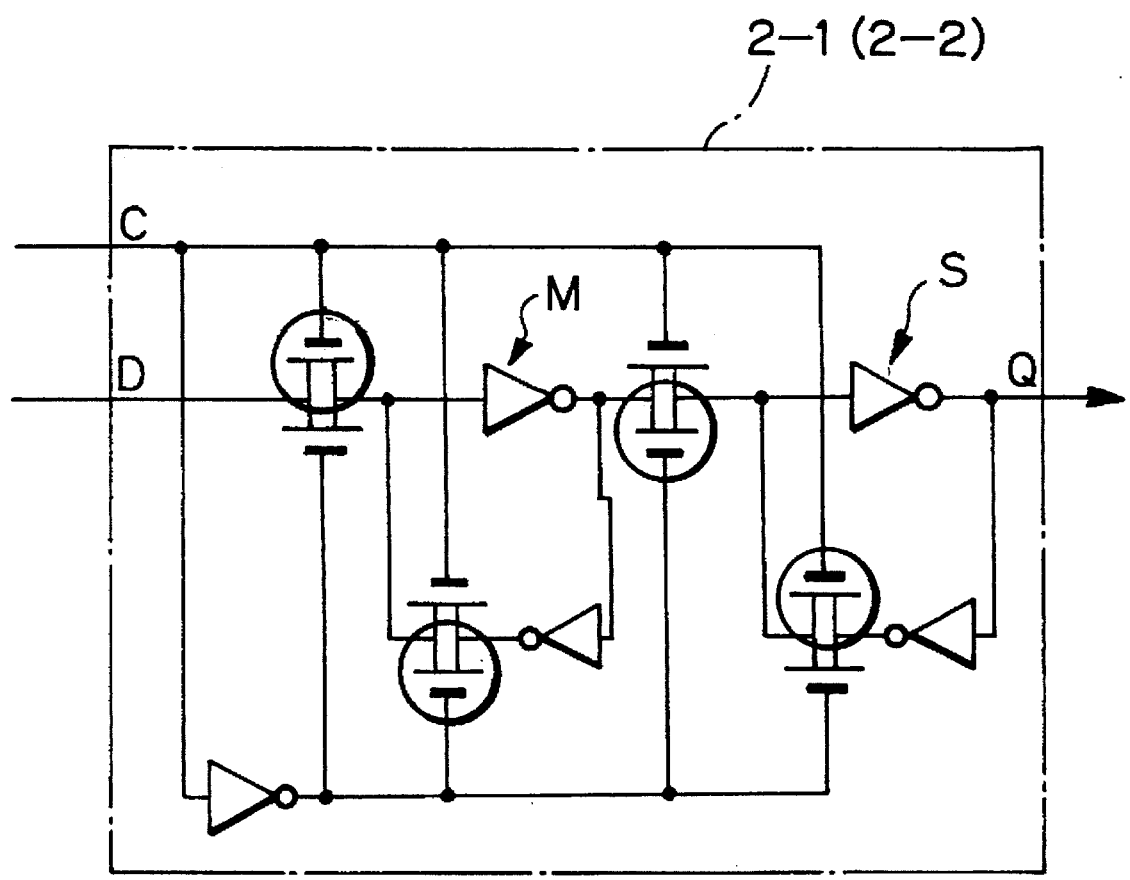
FIG. 3 is a circuit diagram of the latch circuit of FIG. 1.
Figure 4A:
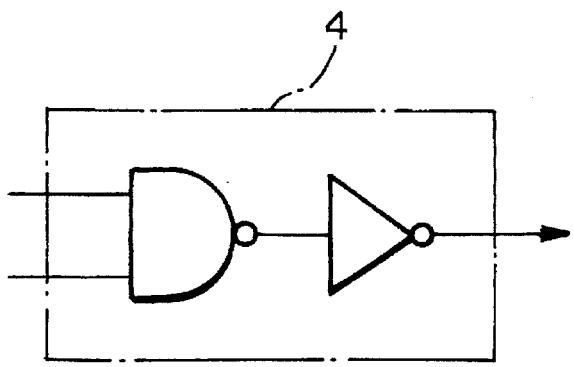
FIGS. 4A, 4B, 4C and 4D are logic circuit diagrams of the logic circuit of FIG. 1.
Figure 4B:
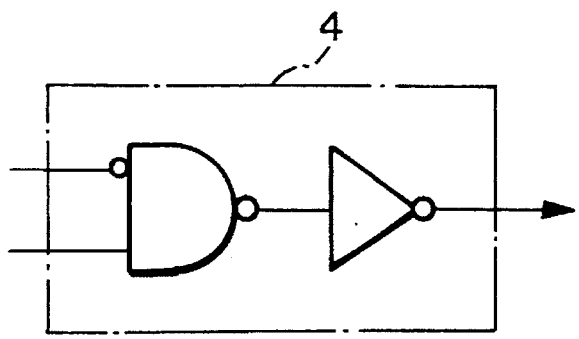
Figure 4C:
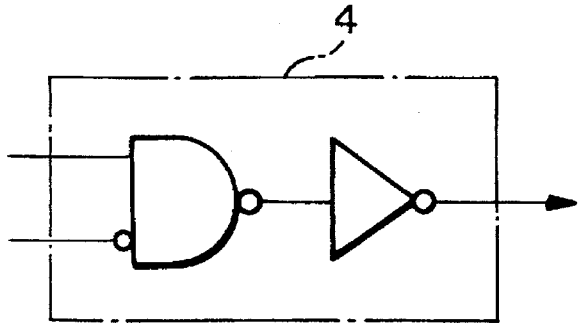
Figure 4D:
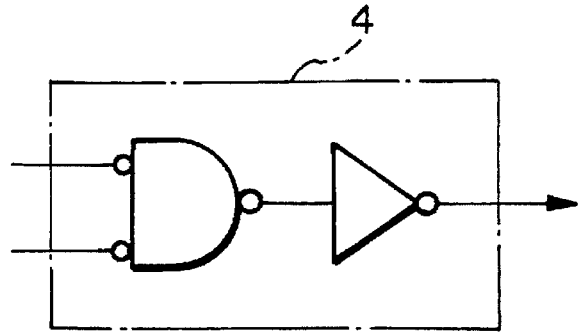

In FIG. 3, which is a detailed circuit diagram of the latch circuit 2-1 (2-2) of FIG. 1, a D-type flip-flop formed by a master latch M and a slave latch S is used. That is, when the voltage at a clock terminal C is low, the voltage at a data terminal D is fetched into the master latch M. Then, when the voltage of the clock terminal C is high, the content of the master latch M is fetched into the slave latch S. The content of the slave latch S is output at an output terminal Q.

FIGS. 4A, 4B, 4C and 4D illustrate examples of the logic circuit 4 of FIG. 1.

The operation of the apparatus of FIG. 1 is explained with reference to FIGS. 5A through 5I.

As shown in FIGS. 5A, 5B and 5C, the logic signals $A_o$ and CS are changed from $t_1$ to $t_3$ while the system clock signal CLK rises at time $t_2$. That is, a set up time $T_S$ of the logic signals $A_o$ and CS with respect to the rising edge of the clock signal CLK is a time from $t_1$ to $t_2$, and a hold time $T_H$ of the logic signals $A_o$ and CS is a time from $t_2$ to $t_3$.

As shown in FIGS. 5D, 5E and 5F, since the delay times of the input circuits 1-1, 1-2 and 1-3 are the same (=D1), the output signals CLK', $A_o'$ and CS' thereof have the same temperal relationship as the signals CLK, $A_o$ and CS. Thus, at time $t_4$, the output signals $A_o'$ and CS' of the input circuits 1-2 and 1-3 are latched in the latch circuits 2-1 and 2-2 in synchronization with the system clock signal CLK'.

Next, as shown in FIG. 5G, after the delay time D2 has passed, the output signals S1 and S2 of the latch circuits 2-1 and 2-2 are changed at time $t_5$.

Next, as shown in FIG. 5H, after the delay time D3 has passed, the output signals S3 and S4 of the delay lines 3-1 and 3-2 are changed at time $t_6$.

Finally, the logic circuit 4 performs a logic operation upon the output signals S3 and S4 of the delay lines 3-1 and 3-2. As a result, as shown in FIG. 5I, the logic circuit 4 generates its output signal S5 at time $t_7$.

Thus, an access time T1 of the apparatus of FIG. 1 is represented by $$T1 = T_S + D1 + D2 + D3 + D4 + tm \quad (1)$$

In the apparatus of FIG. 1, however, as stated above, use is not made of the set up time $T_S$, and as a result, the transfer rate of data is decreased by the system clock signal. This decreases the access speed of the apparatus. Also, there may be skew between the output signals S3 and S4 of the delay lines 3-1 and 3-2, due to the difference in path of time signal CLK' between the arch circuits 2-1 and 2-2, the slight difference in operation speed between the latch circuits 2-1 and 2-2, and the slight difference in delay time between the delay lines 3-1 and 3-2. This creates hazard in the output signal S5 of the logic circuit 4.

Figure 6:
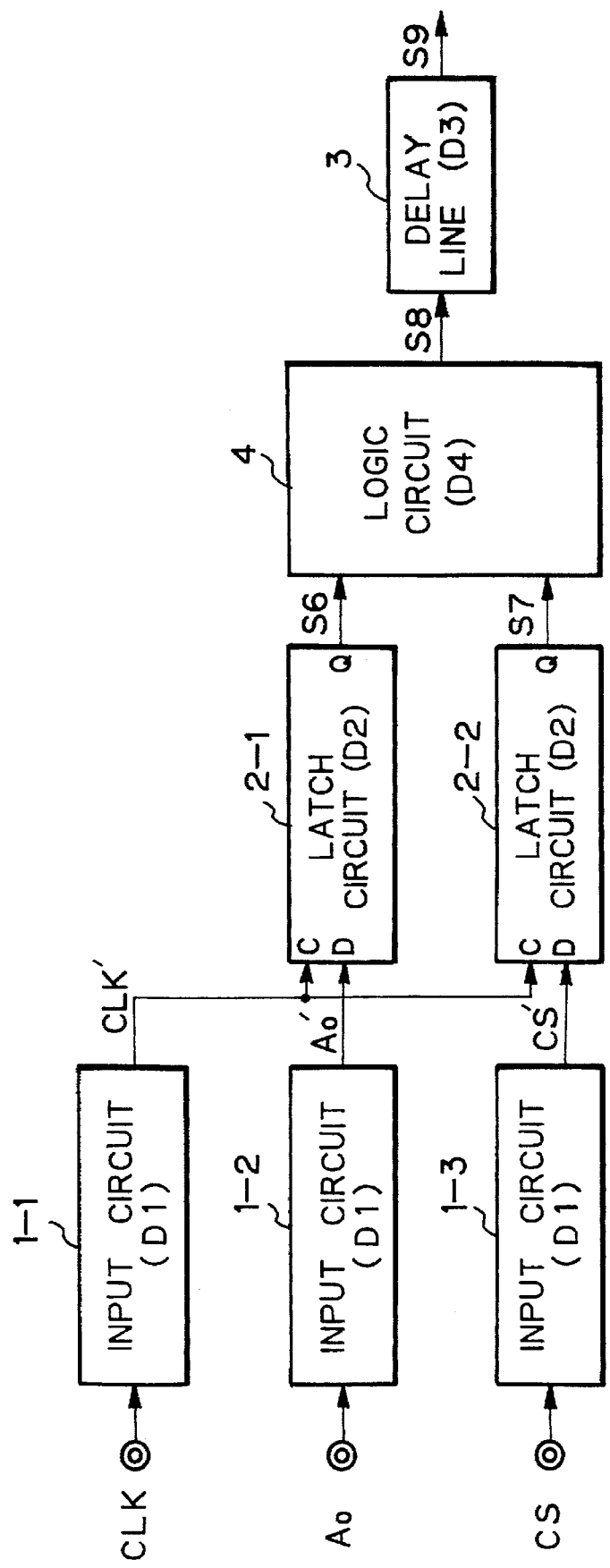
FIG. 6 is a block circuit diagram illustrating a second prior art logic data latch apparatus.

In FIG. 6, which illustrates a second prior art logic data latch apparatus, the logic circuit 4 of FIG. 1 is connected directly to the latch circuits 2-1 and 2-2, and a delay line 3 instead of the delay lines 3-1 and 3-2 of FIG. 1 is connected to time logic circuit 3.

The operation of the apparatus of FIG. 6 is explained with reference to FIGS. 7A through 7I.

As shown in FIGS. 7A through 7F, the signals CLK, $A_o$, CS, CLK', $A_o'$ and CS' are related in the same way as in FIGS. 6A through 6F.

Figure 7:
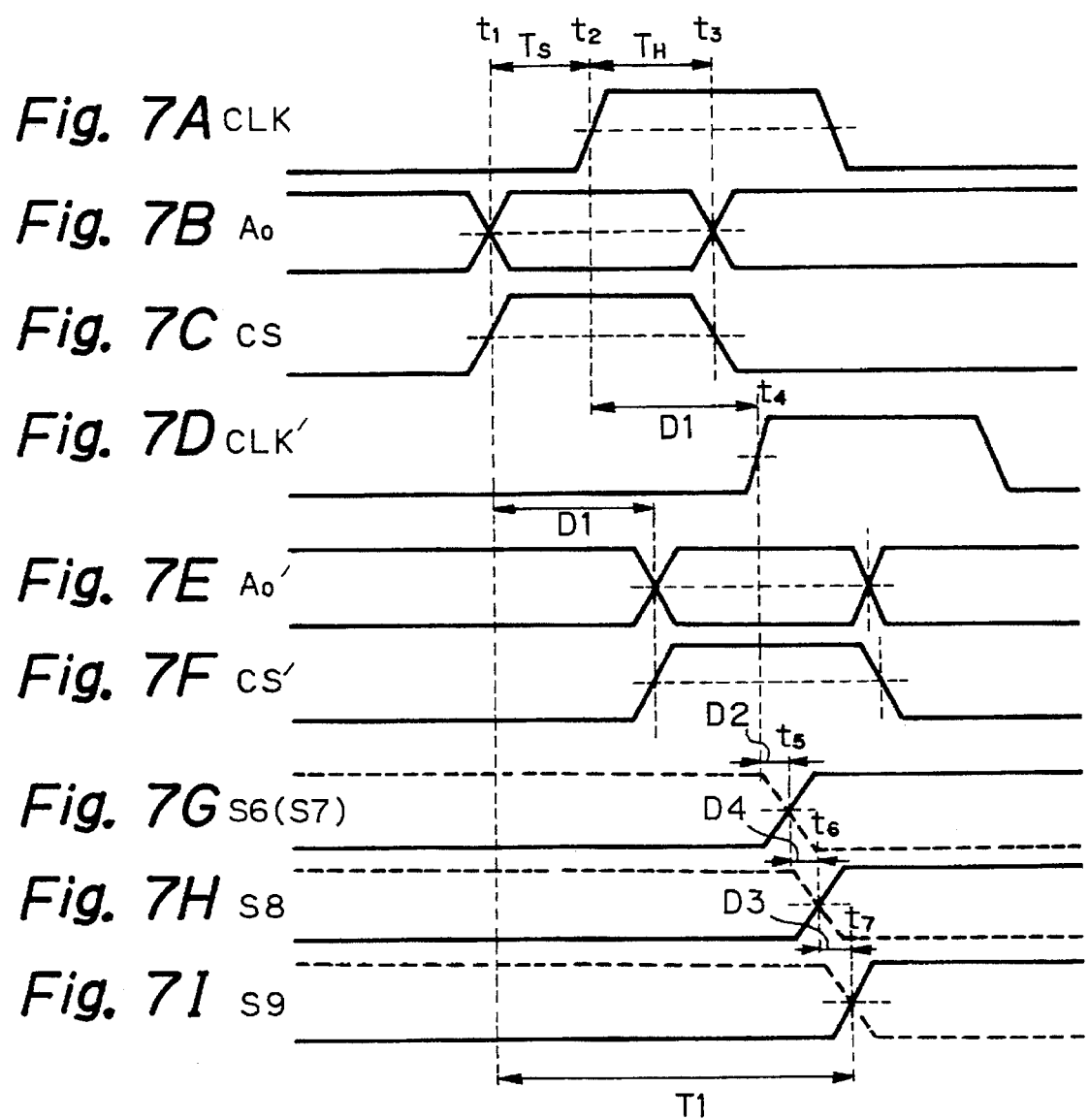
FIGS. 7A through 7I are timing diagrams for showing the operation of the apparatus of FIG. 6.

Next, as shown in FIG. 7G, after the delay time D2 has passed, the output signals S6 and S7 of the latch circuits 2-1 and 2-2 are changed at time $t_5$.

Next, the logic circuit 4 performs a logic operation upon the output signals S6 and S7 of the latch circuits 2-1 and 2-2. As a result, as shown in FIG. 7H, the logic circuit 4 generates its output signal S8 at time $t_6$.

Finally, as shown in FIG. 7I, after the delay time D2 has passed, the output signal S9 of the delay line 3 is changed at time $t_7$.

Thus, an access time T1' of the apparatus of FIG. 6 is represented by $$\begin{aligned} T1' &= T_s + D1 + D2 + D4 + D3 \\ &= T1 \end{aligned} \quad (2)$$

Also, in the apparatus of FIG. 6, use is not made of the set up time $T_S$, and as a result, the transfer rate of data is decreased by the system clock signal. This decreases an access speed of the apparatus. Also, there may be skew between the output signals S6 and S7 of the latch circuits 2-1 and 2-2, due to the difference in path of the signal CLK' between the latch circuits 2-1 and 2-2, and the slight difference in operation speed between the latch circuits 2-1 and 2-2. This creates hazard in the output signal S8 of the logic circuit 4.

Figure 8:
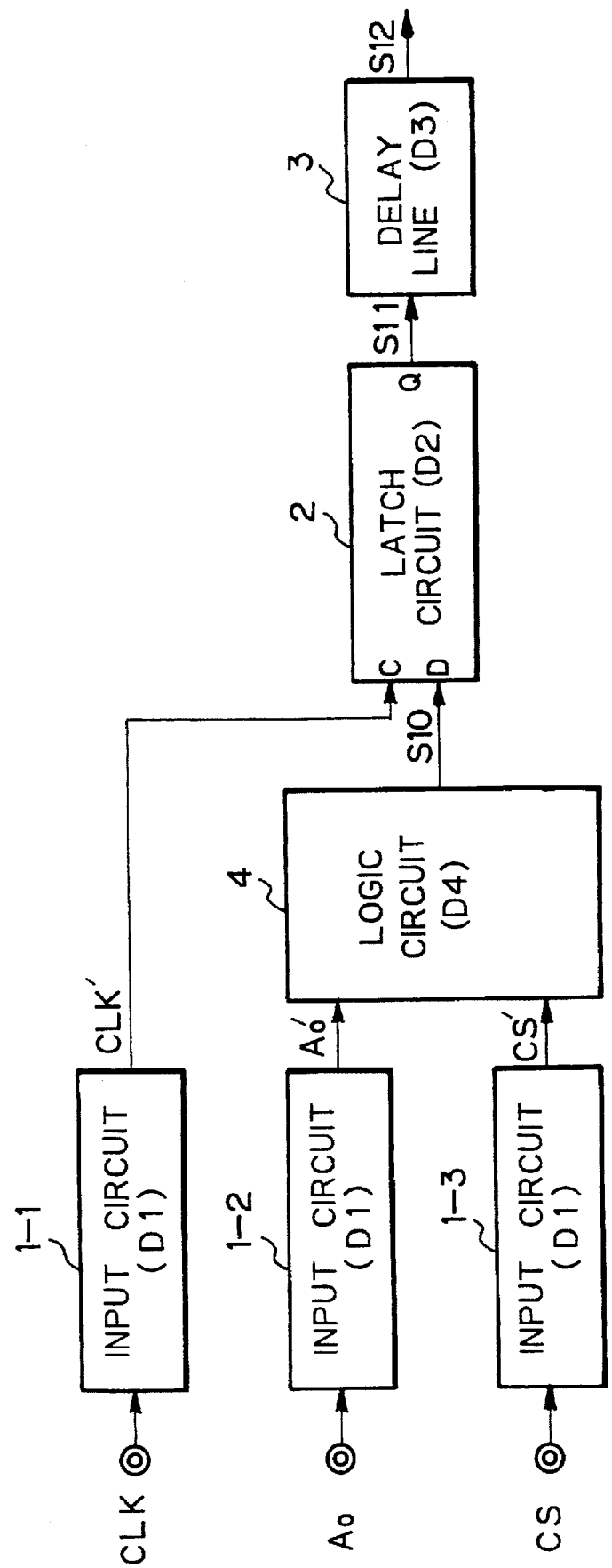
FIG. 8 is a block circuit diagram illustrating a first embodiment of the logic data latch apparatus according to the present invention.

In FIG. 8, which illustrates a first embodiment of the present invention, the logic circuit 4 of FIG. 6 is connected directly to the input circuits 1-2 and 1-3, and only one latch circuit 2 is provided instead of the latch circuits 2-1 and 2-2 of FIG. 6.

The operation of the apparatus of FIG. 8 is explained next with reference to FIGS. 9A through 9I.

As shown in FIGS. 9A through 9F, the signals CLK, $A_o$, CS, CLK', $A_o'$ and CS' are changed in the same way as in FIGS. 6A through 6F.

Before time $t_5$, the logic circuit 4 performs a logic operation upon the output signals $A_o'$ and CS' of the input circuits 1-2 and 1-2. As a result, as shown in FIG. 9G, the logic circuit 4 generates its output signal S10 at time $t_4$.

Figure 9:
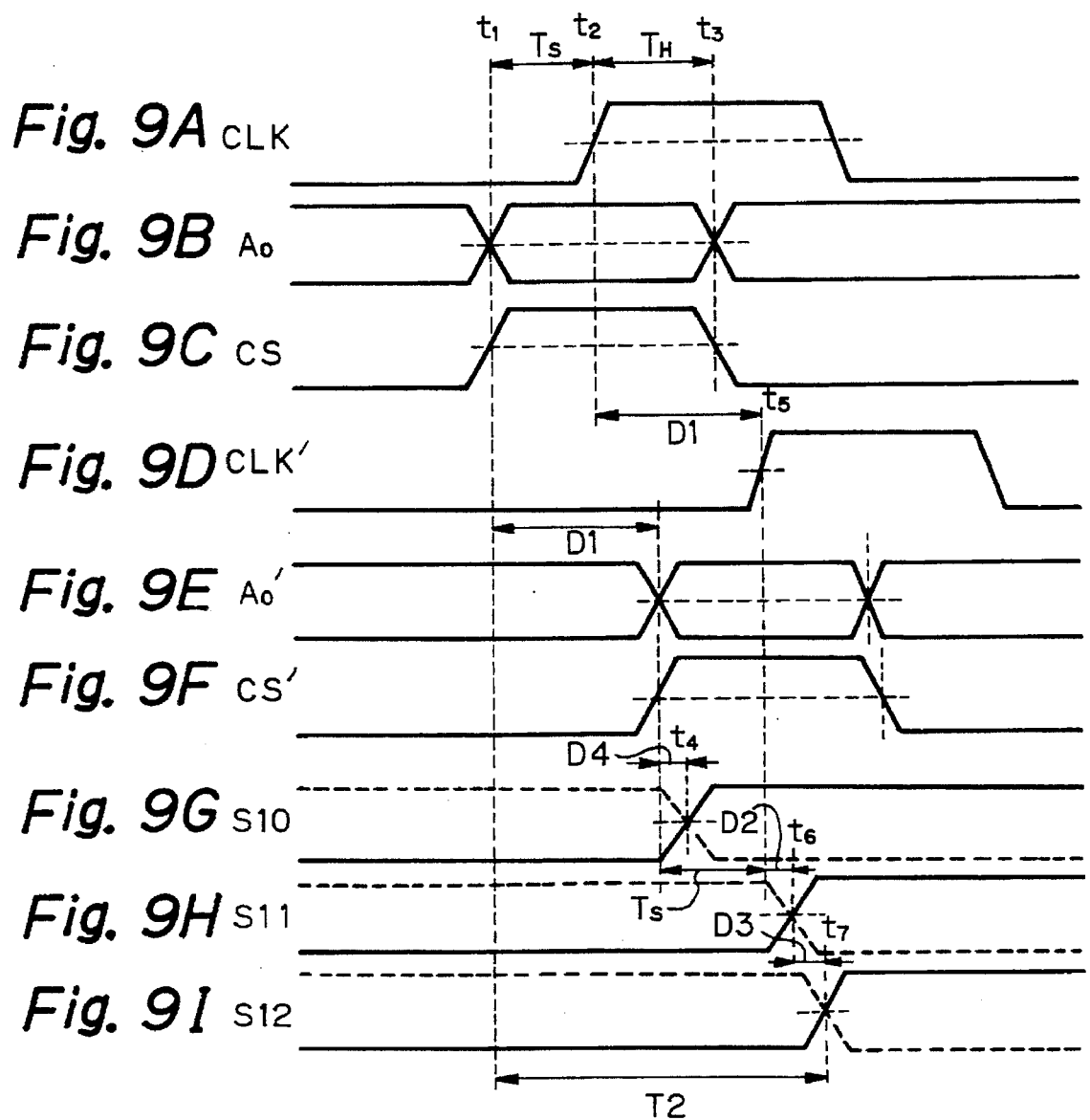
FIGS. 9A through 9I are timing diagrams for showing the operation of the apparatus of FIG. 8.

Next, as shown in FIG. 9H, at time $t_5$, the output S10 of the logic circuit 4 is latched in the latch circuit 2 in synchronization with the system clock signal CLK'. As a result, after the delay time D2 has passed, the output signal S11 of the latch circuit 2 is changed at time $t_6$.

Finally, as shown in FIG. 9I, after the delay time D2 has passed, the output signal S12 of the delay line 3 is changed at time $t_7$.

Thus, an access time T2 of the apparatus of FIG. 8 is represented by $$T2 = T_s + D1 + D2 + D3 \qquad (3)$$
$$= T1 - D4 < T1$$

Thus, in the apparatus of FIG. 8, since the logic operation by the logic circuit 4 is carried out within the set up time $T_S$, the access time T2 is reduced by D4 as compared with the prior art apparatuses of FIGS. 1 and 6. In other words, use is made of the set up time $T_S$. This increases the access speed of the apparatus of FIG. 8. Also, since the logic circuit 4 is connected directly to the input circuits 1-2 and 1-3, there is no skew between the input signals of the logic circuit 4, so that hazard in time output signal thereof can be avoided.

Figure 10:
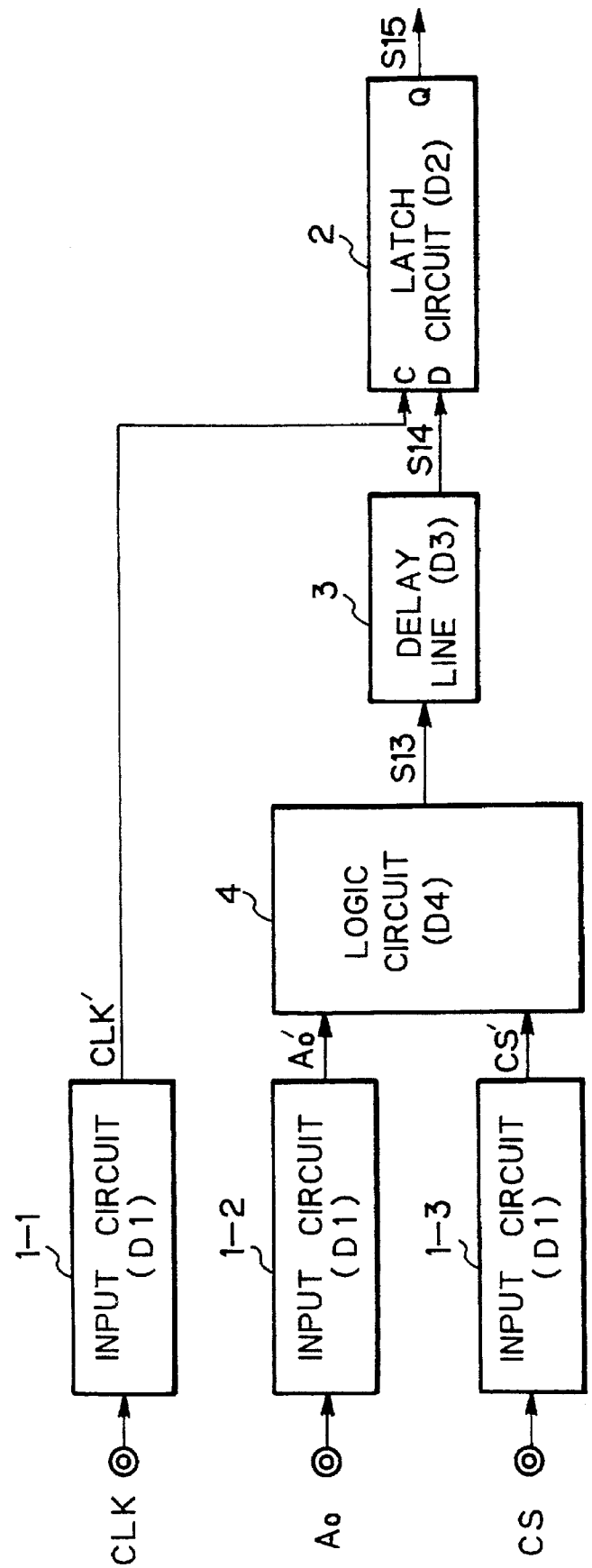
FIG. 10 is a block circuit diagram illustrating a second embodiment of the logic data latch apparatus according to the present invention.

In FIG. 10, which illustrates a second embodiment of the present invention, the delay line 3 of FIG. 8 is connected between the logic circuit 4 and the latch circuit 2. That is, the latch circuit 2 is a long way from the logic circuit 4.

The operation of the apparatus of FIG. 10 is explained next with reference to FIGS. 11A through 11I.

As shown in FIGS. 11A through 11F, the signals CLK, $A_o$, CS, CLK', $A_o'$ and CS' are changed in the same way as in FIGS. 6A through 6F.

Before time $t_6$, the logic circuit 4 performs a logic operation upon the output signals $A_o'$ and CS' of the input circuits 1-2 and 1-2. As a result, as shown in FIG. 11G, the logic circuit 4 generates its output signal S13 at time $t_4$.

Figure 11:
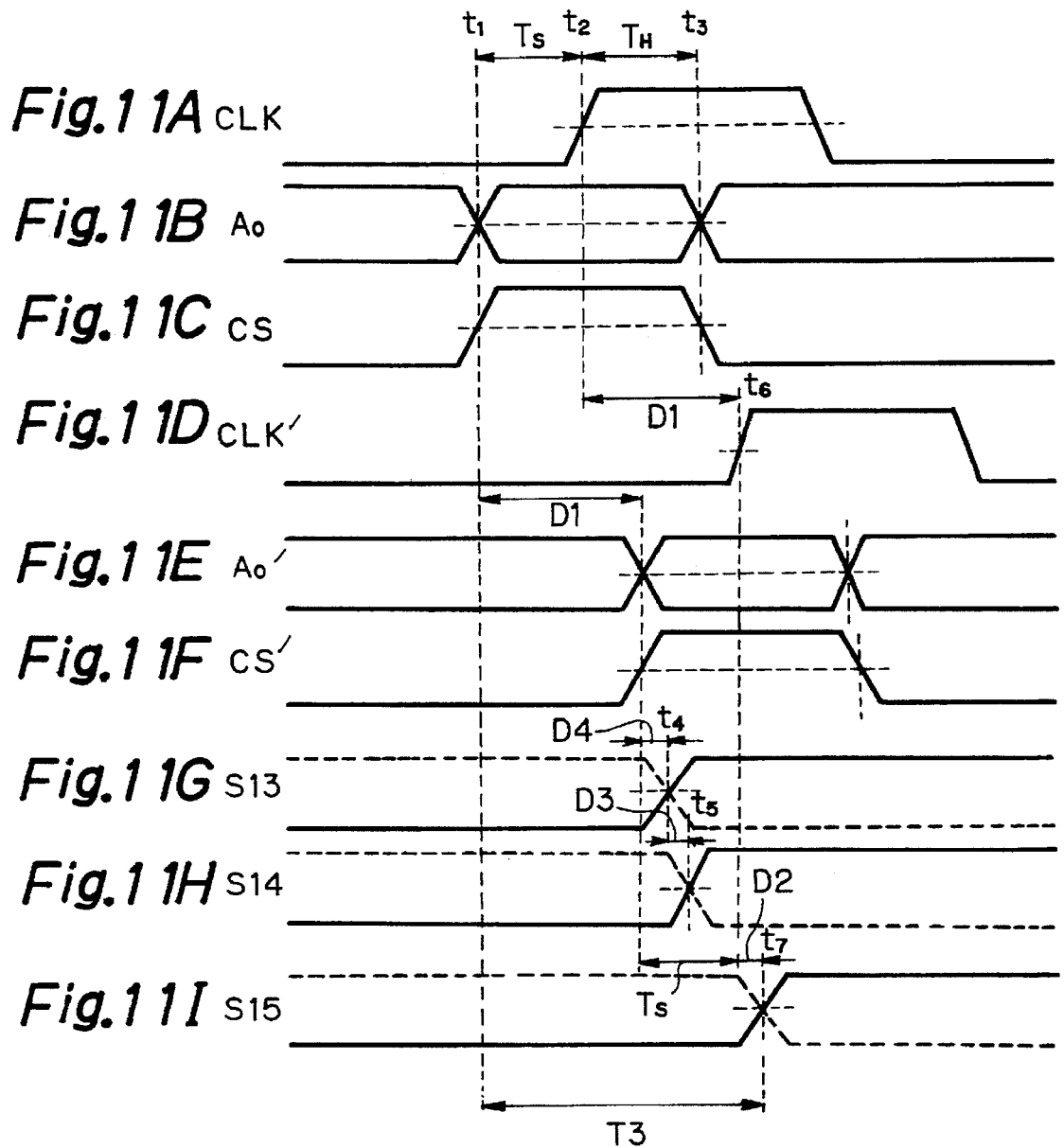
FIGS. 11A through 11I are timing diagrams for showing the operation of the apparatus of FIG. 10.

Then, as shown in FIG. 11H, at time $t_6$, the output S14 of the delay line 3 is latched in the latch circuit 4 in synchronization with the system clock signal CLK'.

Finally, as shown in FIG. 11I, after the delay time D2 has passed, the output signal S15 of the delay line 3 is changed at time $t_7$.

Thus, an access time T3 of the apparatus of FIG. 10 is represented by $$T3 = T_s + D1 + D2 \qquad (4)$$
$$= T2 - D3 < T2$$

That is,
T3<T2<T1

Thus, in the apparatus of FIG. 10, since the logic operation by the logic circuit 4 and the delay operation by the delay line 3 are carried out within the set tip time $T_S$, the access time T3 is reduced by D3+D4 as compared with the prior art apparatuses of FIGS. 1 and 6. In other words, use is made of the set tip time $T_S$. This further increases the access speed of the apparatus of FIG. 10. Also, since the logic circuit 4 is connected directly to the input circuits 1-2 and 1-3, there is no skew between the input signals of the logic circuit 4, so that hazard in the output signal thereof can be avoided.

Figure 12:
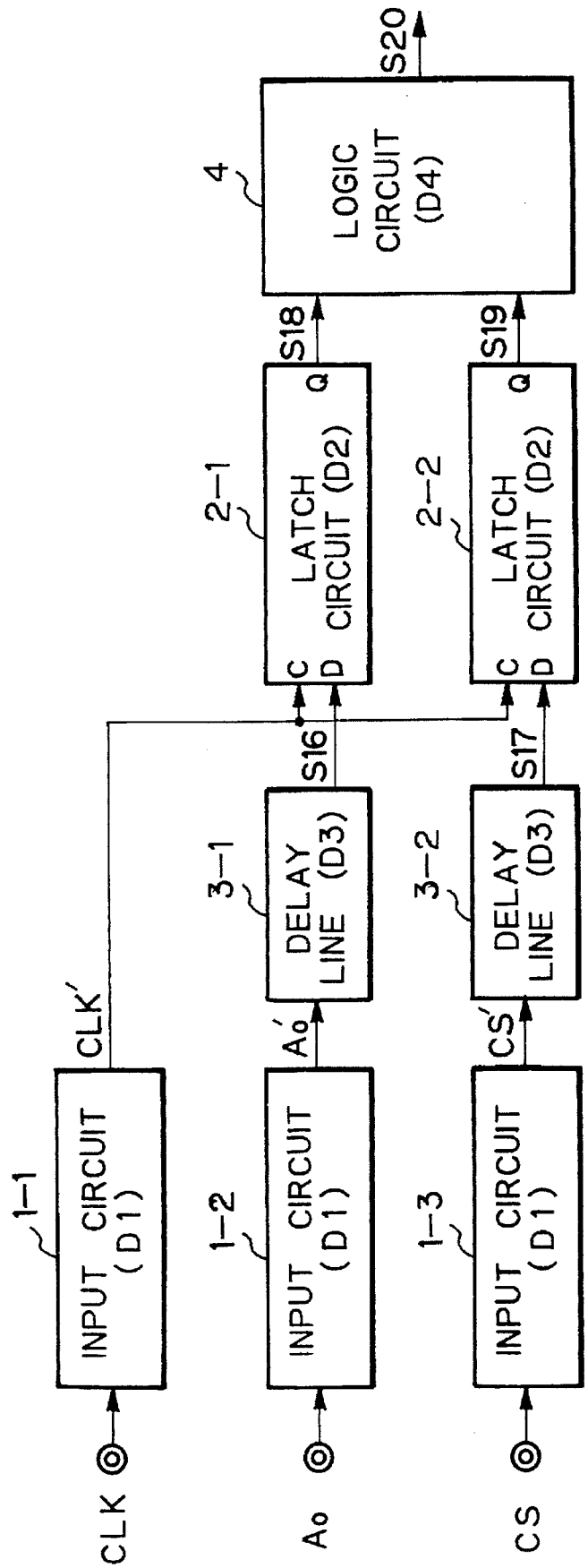
FIG. 12 is a block circuit diagram illustrating a third embodiment of the logic data latch apparatus according to the present invention.

In FIG. 12, which illustrates a third embodiment of the present invention, the delay lines 3-1 and 3-2 of FIG. 1 are connected between the input circuits 1-2 and 1-3 and the latch circuits 2-1 and 2-2. That is, the latch circuits 2-1 and 2-2 are a long way from the input circuits 1-2 and 1-1, respectively.

The operation of the apparatus of FIG. 12 is explained next with reference to FIGS. 13A through 13I.

As shown in FIGS. 13A through 13F, the signals CLK, $A_o$, CS, CLK', $A_o'$ and CS' are changed in the same way as in FIGS. 6A through 6F.

Figure 13:
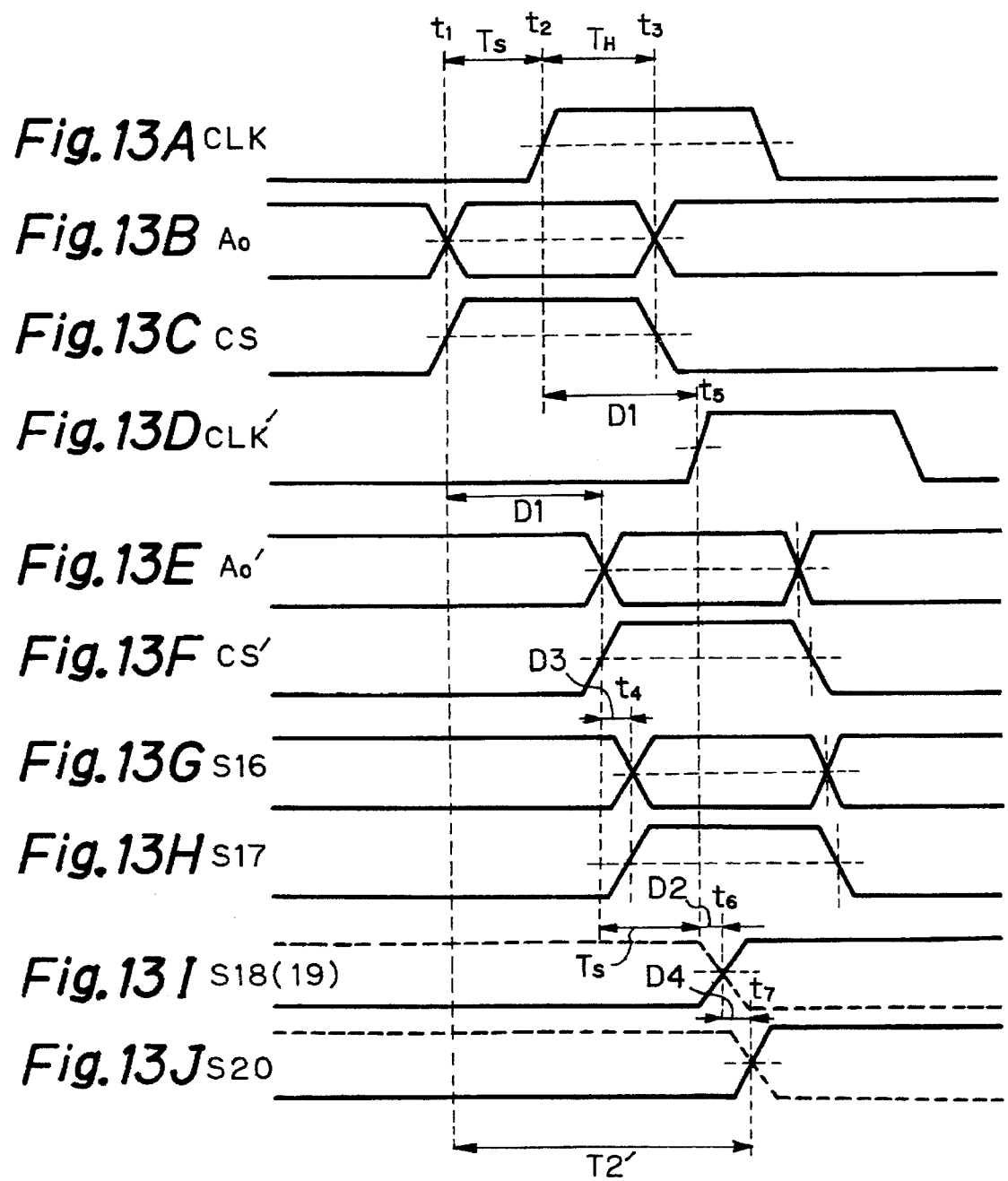
FIGS. 13A through 13J are timing diagrams for showing the operation of the apparatus of FIG. 12.

Before time $t_5$, as shown in FIGS. 13G and 13H, the output signals $A_o'$ and CS' of the input circuits 1-2 and 1-3 are delayed by the delay lines 3-1 and 3-2, respectively. As a result, at time $t_4$, the output signals S16 and S17 of the delay lines 3-1 and 3-2 are changed.

Next, as shown in FIG. 13I, at time $t_5$, the output signals S16 and S17 of the delay lines 3-1 and 3-2 are latched in the latch circuits 2-1 and 2-2 in synchronization with the system clock signal CLK'. As a result, after the delay time D2 has passed, the output signals S18 and S19 of the latch circuit 2-1 and 2-2 are changed at time $t_6$.

Finally, the logic circuit 4 performs a logic operation upon the output signals S18 and S19 of the latch circuits 2-1 and 2-2. As a result, as shown in FIG. 13J, the logic circuit 4 generates its output signal S20 at time $t_7$.

Thus, an access time T2' of the apparatus of FIG. 12 is represented by $$T2' = T_s + D1 + D2 + D4 \qquad (5)$$
$$= T1 - D3 < T1$$

Thus, in the apparatus of FIG. 12, since the delay operation by the delay lines 3-1 and 3-2 is carried out within the set up time $T_S$, the access time T2' is reduced by D3 as compared with the prior art apparatuses of FIGS. 1 and 6. In other words, use is made of the set up time $T_S$. This increases the access speed of the apparatus of FIG. 12.

Figure 14:
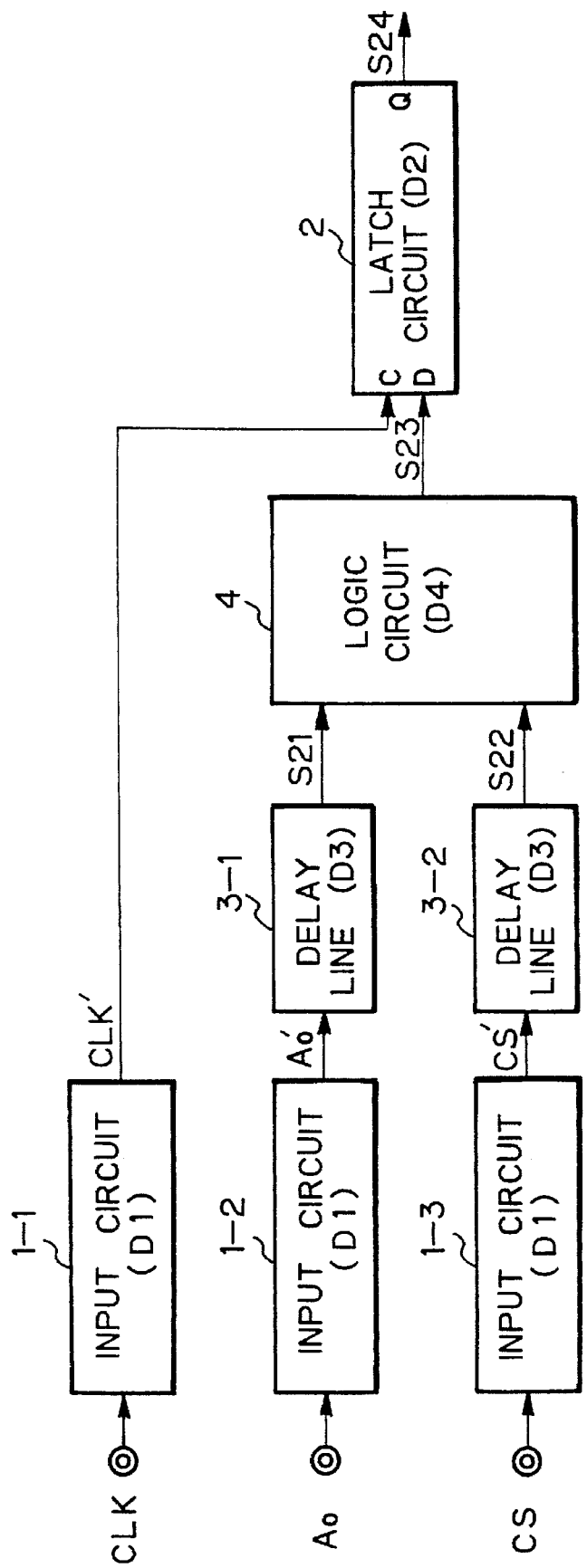
FIG. 14 is a block circuit diagram illustrating fourth embodiment of the logic data latch apparatus according to the present invention.

In FIG. 14, which illustrates a fourth embodiment of the present invention, the logic circuit 4 of FIG. 12 is connected between the delay lines 3-1 and 3-2 and the latch circuit 2. That is, the logic circuit 4 is a long way from the input circuits 1-2 and 1-3.

The operation of the apparatus of FIG. 14 is explained next with reference to FIGS. 15A through 15J.

As shown in FIGS. 15A through 15F, the signals CLK, $A_o$, CS, CLK', $A_o'$ and CS' are related in the same way as in FIGS. 6A through 6F.

Figure 15:
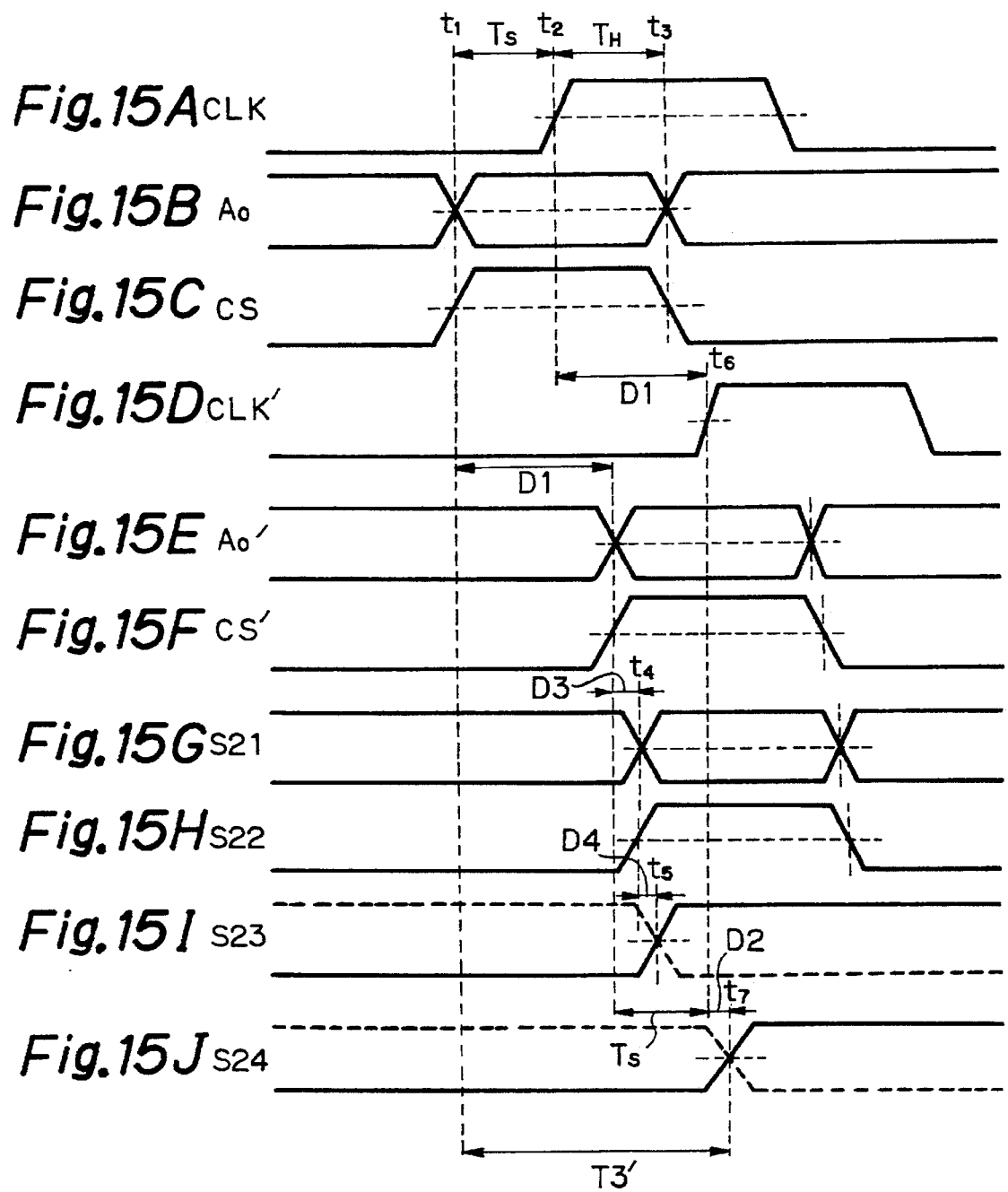
FIGS. 15A through 15J are timing diagrams for showing the operation of the apparatus of FIG. 14.

Before time $t_6$, as shown in FIGS. 15G and 15H, the delay operation of the delay lines 3-1 and 3-2 is performed upon the output signals $A_o'$ and CS' of the input circuits 1-2 and 1-3. Also, before time $t_6$, as shown in FIG. 15I, the logic circuit 4 performs a logic operation upon the output signals S21 and S22 of the delay lines 3-1 and 3-2. As a result, at time $t_5$, the logic circuit 4 generates its output signal S23.

Finally, as shown in FIG. 15J, at time $t_7$, the output S24 of the logic circuit 4 is latched in the latch circuit 2 in synchronization with the system clock signal CLK'. As a result, after the delay time D2 has passed, the output signal S24 of the latch circuit 2 is changed at time $t_7$.

Thus, an access time T3' of the apparatus of FIG. 14 is represented by $$T3' = T_s + D1 + D2 \qquad (6)$$
$$= T2' - D4 < T2'$$

That is,
T3'(=T3)<T2'<T1

Thus, in the apparatus of FIG. 14, since the delay operation by the delay lines 3-1 and 3-2 and the logic operation by the logic circuit 4 carried out within the set up time $T_S$, the access time T3' is reduced by D3+D4 as compared with the prior art apparatuses of FIGS. 1 and 6. In other words, use is made of the set up time $T_S$. This further increases the access speed of the apparatus of FIG. 14. Also, since the logic circuit 4 is connected via the delay lines 3-1 and 3-2 input circuits 1-2 and 1-3, there is little skew between the input signals of the logic circuit 4, so that hazard in the output signal thereof can be avoided.

Figure 16:
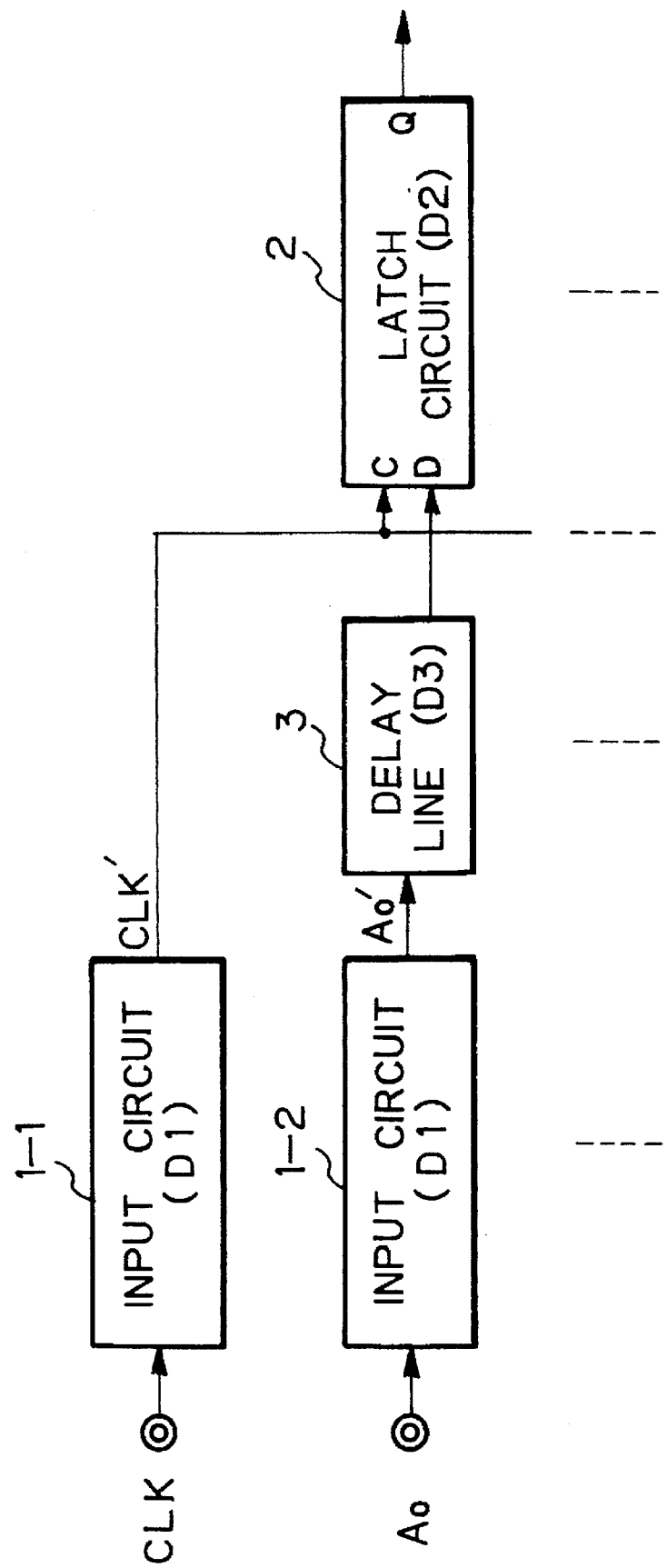
FIG. 16 is a block circuit diagram illustrating a fifth embodiment of the logic data latch apparatus according to the present invention.

In FIG. 16, which illustrates a fifth embodiment of the present invention, even when a logic operation is unnecessary, the delay line 3 is connected between the input circuit 1-2 and the latch circuit 2, to thereby increase the access speed in a similar way as in the fourth embodiment as illustrated in FIG. 12.

Figure 17:
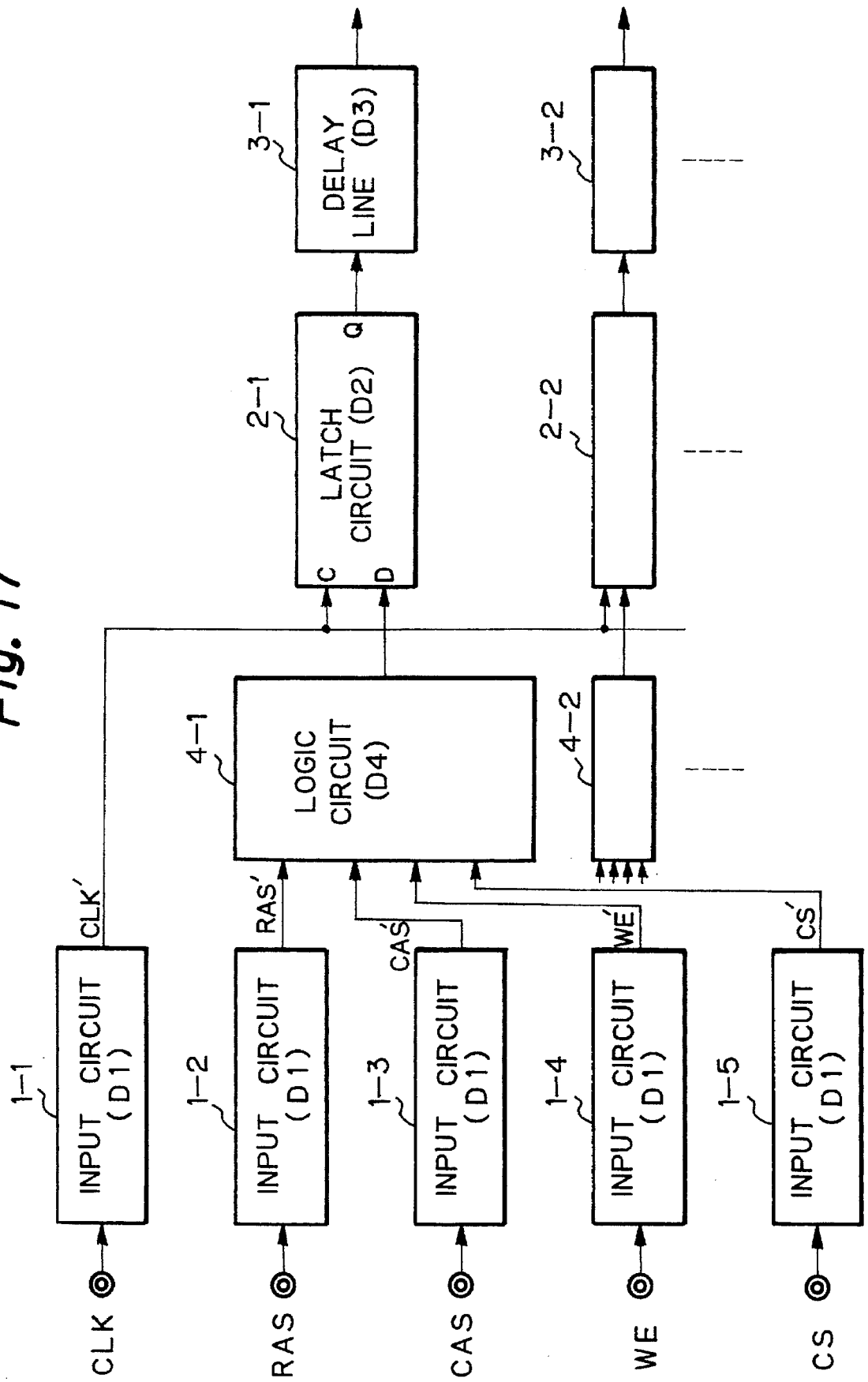
FIG. 17 is a block circuit diagram illustrating a sixth embodiment of the logic data latch apparatus according to the present invention.

In FIG. 17, which illustrates a sixth embodiment of the present invention, the first embodiment as illustrated in FIG. 8 is applied to a synchronous DRAM. That is, input circuits 1-2 to 1-5 for receiving control signals RAS, CAS, WE and CS are connected to logic circuits 4-1, 4-2, . . . , respectively, for performing logic operations upon the output signals of the input circuits 1-2, 1-3, . . . Also, the logic circuits 4-1, 4-2, . . . are connected to latch circuits 2-1, 2-2, . . . , respectively, which are operated in synchronization with the system clock signal CLK'. Further, the latch circuits 2-1, 2-2, . . . are connected to delay lines 3-1, 3-2, . . . , respectively.

Thus, in the synchronous DRAM of FIG. 17, since the logic operations by the logic circuit 4-1, 4-2, . . . are carried out within the set up time $T_S$, the access time can be reduced. In other words, use is made of the set up time $T_S$. This increases the access speed of the synchronous DRAM of FIG. 17. Also, since the logic circuits 4-1, 4-2, . . . are connected directly to the input circuits 1-2, 1-3, . . . there is no skew between the input signals of the logic circuits 4-1, 4-2, . . . so that hazard in the output signal thereof can be avoided.

Figure 18:
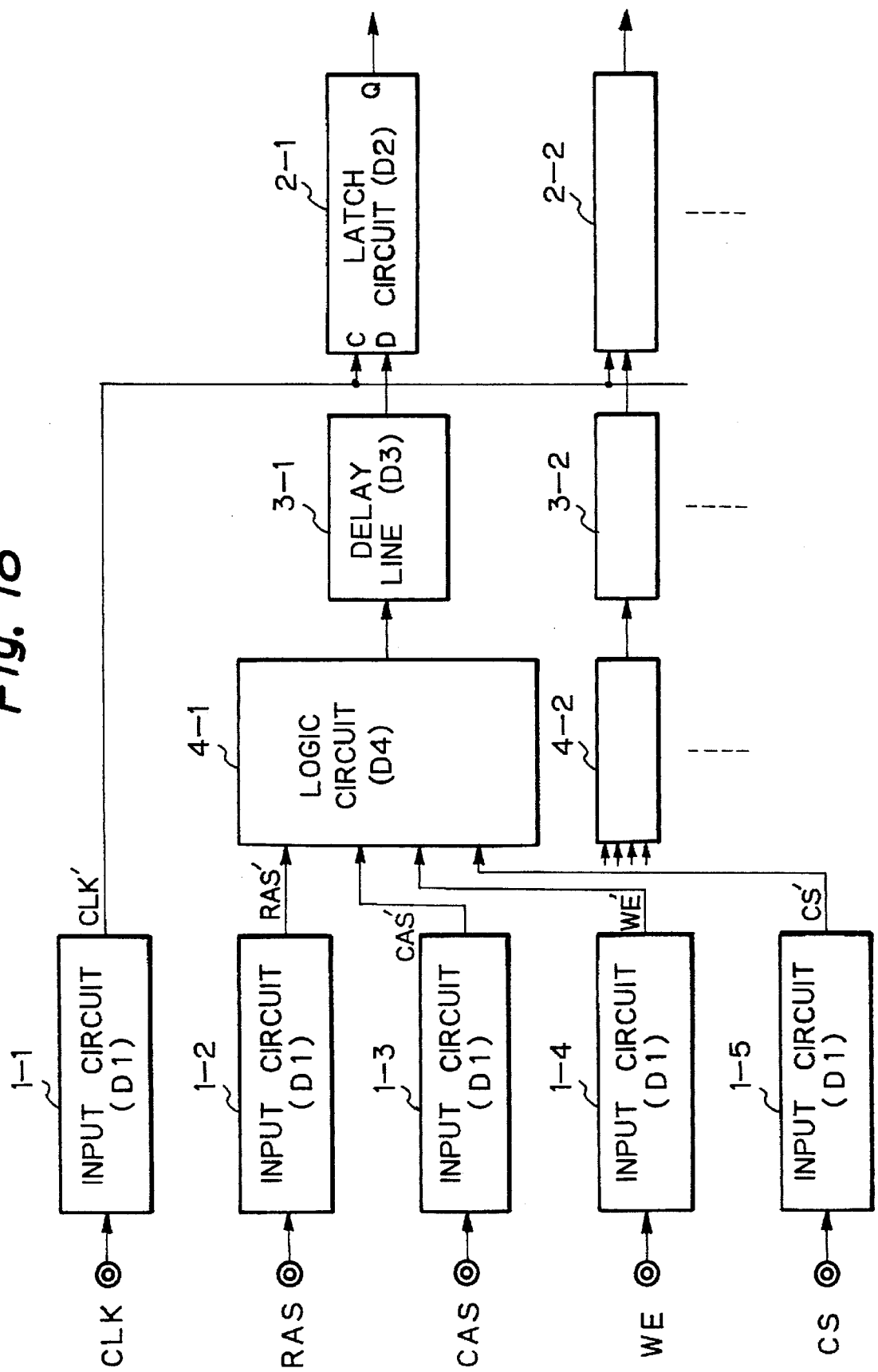
FIG. 18 is a block circuit diagram illustrating a seventh embodiment of the logic data latch apparatus according to the present invention.

In FIG. 18, which illustrates a seventh embodiment of the present invention, the second embodiment as illustrated in FIG. 10 is applied to a synchronous DRAM. That is, input circuits 1-2 to 1-5 for receiving control signals RAS, CAS, WE and CS are connected to logic circuits 4-1, 4-2, . . . , respectively, for performing logic operations upon the output signals of the input circuits 1-2, 1-3, . . . . Also, the logic circuits 4-1, 4-2, . . . are connected to delay lines 3-1, 1-2, . . . , respectively. Further, the delay circuits 3-1, 3-2, . . . are connected to latch circuits 2-1, 2-2, . . . which are operated in synchronization with the system clock signal CLK'.

Thus, in the synchronous DRAM of FIG. 18, since the logic operations by the logic circuits 4-1 , 4-2, . . . and the delay operations by the delay lines 3-1, 3-2, . . . is are carried out within the set up time $T_S$, the access time can be reduced. In other words, use is made of the set up time $T_S$. This further increases the access speed of the synchronous DRAM of FIG. 18. Also, since the logic circuits 4-1, 4-2, . . . are connected directly to the input circuits 1-2, 1-3, . . . there is no skew between the input signals of the logic circuits 4-1, 4-2, . . . so that hazard in the output signal thereof can be avoided.

Figure 19:
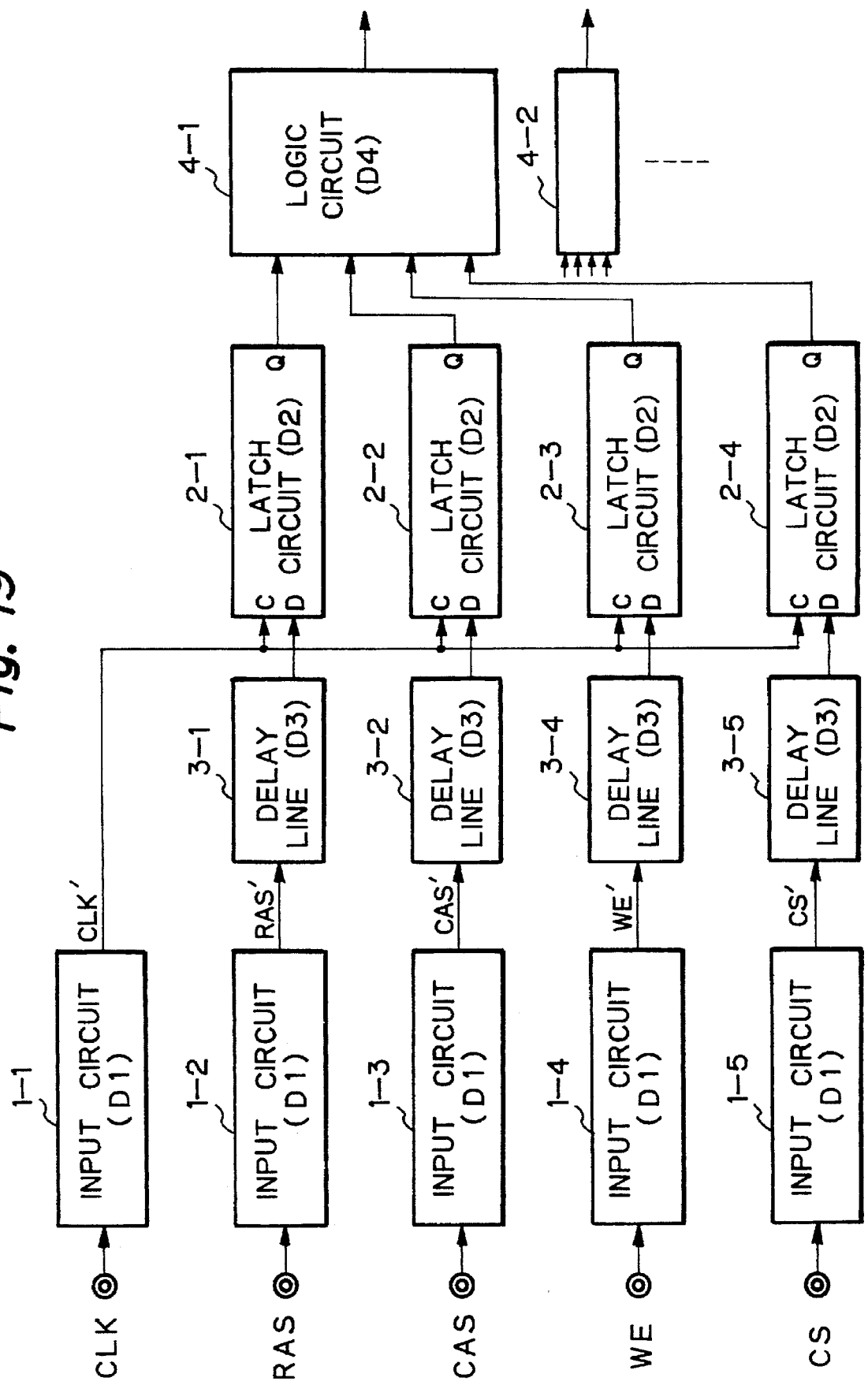
FIG. 19 is a block circuit diagram illustrating an eighth embodiment of the logic data latch apparatus according to the present invention.

In FIG. 19, which illustrates an eighth embodiment of the present invention, the third embodiment as illustrated in FIG. 12 is applied to a synchronous DRAM. That is, input circuits 1-2 to 1-5 for receiving control signals RAS, CAS, WE and CS are connected to delay lines 3-1, 3-2, . . . , respectively. Also, the delay lines 3-1, 3-2, . . . are connected to latch circuits 2-1, 2-2, . . . , respectively, which are operated in synchronization with the system clock signal CLK'. Further, the latch circuits 2-1, 2-2, . . . are connected to logic circuits 4-1, 4-2, . . . , respectively, for performing logic operations upon the output signals of the latch circuits signals of the latch circuits 2-1, 2-2, . . . .

Thus, in the synchronous DRAM of FIG. 19, since the delay operations by the delay lines 3-1, 3-2, . . . are carried out within the set up time $T_S$, the access time can be reduced. In other words, use is made of the set up time $T_S$. This increases the access speed of the synchronous DRAM of FIG. 19.

Figure 20:
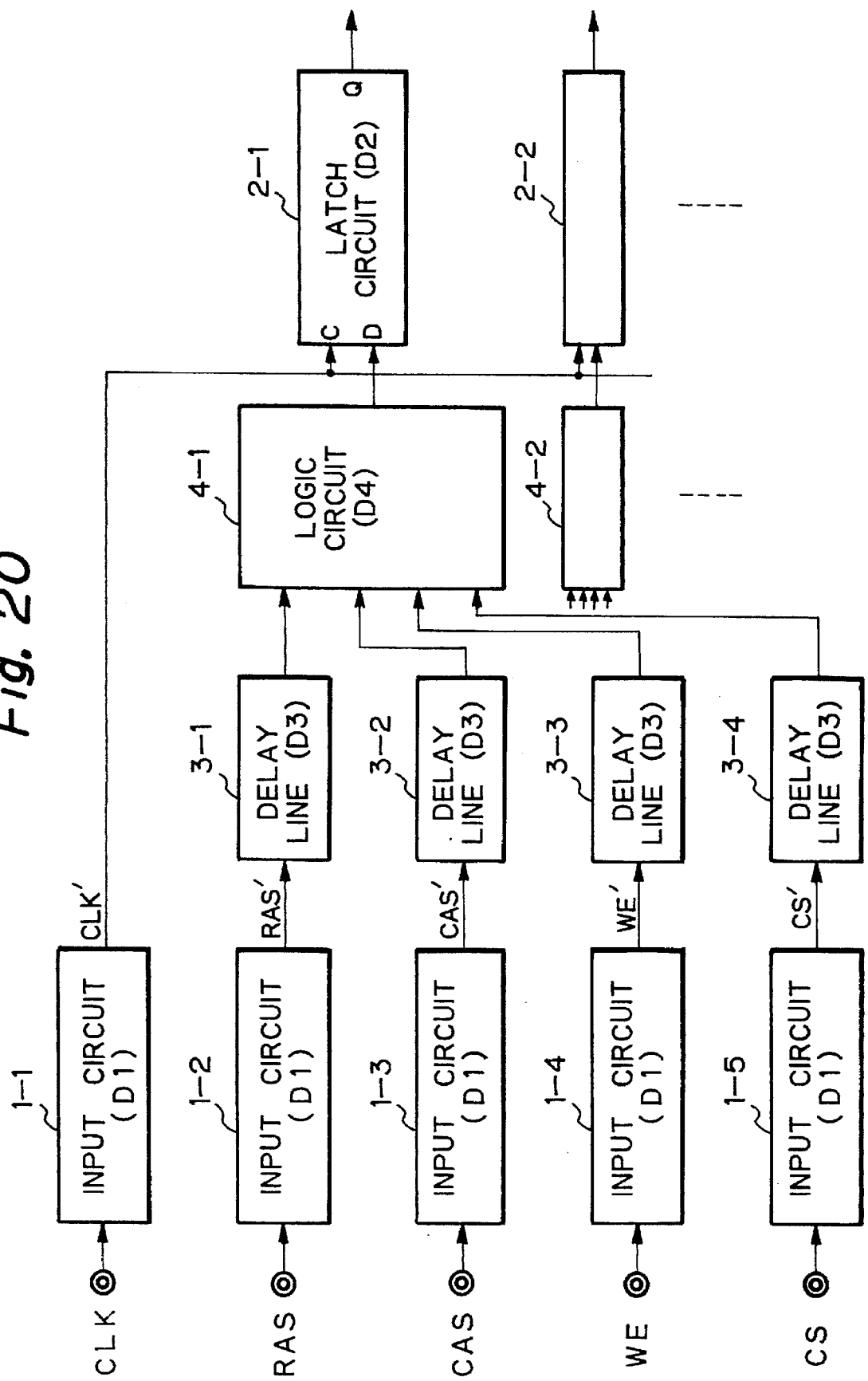
FIG. 20 is a block circuit diagram illustrating a ninth embodiment of the logic data latch apparatus according to the present invention.

In FIG. 20, which illustrates a ninth embodiment of the present invention, the fourth embodiment as illustrated in FIG. 14 is applied to a synchronous DRAM. That is, input circuits 1-2 to 1-5 for receiving control signals RAS, CAS, WE and CS are connected to delay lines 3-1, 3-2, . . . , respectively. Also, the delay lines 3-1, 3-2, . . . are connected to logic circuits 4-1, 4-2, . . . , respectively, for performing logic operations upon the output signals of the delay lines 3-1, 3-2, . . . . Further, the logic circuits 4-1, 4-2, . . . are connected to latch circuits 2-1, 2-2, . . . which are operated in synchronization with the system clock signal CLK'.

Thus, in the synchronous DRAM of FIG. 20, since the logic operations by the delay operation by the delay lines 3-1, 3-2, and the logic circuits 4-1, 4-2, . . . are carried out within the set up time $T_S$, the access time can be reduced. In other words, use is made of the set up time $T_S$. This further increases the access speed of the synchronous of FIG. 18. Also, since the logic circuits 4-1, 4-2, . . . are connected via the delay lines 3-1, 3-2, . . . to the input circuits 1-2, 1-3, . . . there is little skew between the input signals of the logic circuits 4-1, 4-2, . . . so that hazard in the output signal thereof can be avoided.

As explained hereinabove, according to the present invention, the access speed can be increased, and hazard in the logic circuits can be avoided.

I claim:

1. A logic data latch apparatus comprising:

a clock signal input circuit for receiving a clock signal;

at least two logic signal input circuits for receiving logic signals;

a logic circuit, connected to outputs of said logic signal input circuits, for performing a logic operation upon said logic signals; and a latch circuit, connected to said clock signal input circuit and said logic circuit, for latching an output signal of said logic circuit in synchronization with said clock signal, wherein a set up time of said logic signals with respect to said clock signal is larger than a delay time of said logic circuit.

2. A logic data latch apparatus comprising:

a clock signal input circuit for receiving a clock signal;

at least two logic signal input circuits for receiving logic signals;

a logic circuit, connected to outputs of said logic signal input circuits, for performing a logic operation upon said logic signals; and a latch circuit, connected to said clock signal input circuit and said logic circuit, for latching an output signal of said logic circuit in synchronization with said clock signal; and a delay line connected to said latch circuit.

3. A logic data latch apparatus comprising:

a clock signal input circuit for receiving a clock signal;

at least two logic signal input circuits for receiving logic signals;

delay lines, each connected to one of said logic signal input circuits, for delaying said logic signals;

latch circuits, each connected to one of said delay lines, for latching an output signal of a respective one of said delay lines in synchronization with said clock signal; and a logic circuit, connected to said latch circuits, for performing a logic operation upon output signals of said latch circuits.

4. An apparatus as set forth in claim 3, wherein a set up time of said logic signals with respect to said clock signal is larger than a delay time of each of said delay lines.

5. A logic data latch apparatus comprising:

a clock signal input circuit for receiving a clock signal;

at least two logic signal input circuits for receiving logic signals;

a logic circuit, connected to said logic signal input circuits, for performing a logic operation upon said logic signals;

a delay line connected to said logic circuit, for delaying an output signal of said logic circuit;

a latch circuit, connected to said clock signal input circuit and said delay line, for latching an output signal of said delay line in synchronization with said clock signal.

6. An apparatus as set forth in claim 5, wherein a set up time of said logic signals with respect to said clock signal is larger than a sum of a delay time of said logic circuit and a delay time of said delay line.

7. A logic data latch apparatus comprising:

a clock signal input circuit for receiving a clock signal;

at least two logic signal input circuits for receiving logic signals;

delay lines, each connected to one of said logic signal input circuits, for delaying said logic signals;

a logic circuit, connected to said delay lines, for performing a logic operation upon output signals of said delay lines; and a latch circuit, connected to said delay lines, for latching an output signal of said logic circuit in synchronization with said clock signal.

8. An apparatus as set forth in claim 7 wherein a set up time of said logic signals with respect to said clock signal is larger than a sum of a delay time of each of said delay lines and a delay time of said logic circuit.

9. A logic data latch apparatus comprising:

a clock signal input circuit for receiving a clock signal;

a logic signal input circuit for receiving a logic signal.;

a delay line, connected to said logic input circuit; and a latch circuit, connected to said clock signal input circuit and said delay line, for latching an output signal of said delay line in synchronization with said clock signal.

10. An apparatus as set forth in claim 9, wherein a set up time of said logic signal with respect to said clock signal is larger than a delay time of said delay line.

11. A synchronous semiconductor memory device comprising:

a system clock signal input circuit for receiving a system clock signal;

a plurality of control signal input circuits for receiving control signals;

a plurality of logic circuits, connected to outputs of said control signal input circuits, for performing logic operations upon output signals of said control signal input circuits; and a plurality of latch circuits, each connected to one of said logic circuits and to said system clock signal input circuit, for latching an output signal of a respective one of said logic circuits in synchronization with said system clock signal, wherein a set up time of said control signals with respect to said system clock signal is larger than a delay time of said logic circuits.

12. A synchronous semiconductor memory device comprising:

a system clock signal input circuit for receiving a system clock signal;

a plurality of control signal input circuits for receiving control signals;

a plurality of delay lines, each connected to one of said control signal input circuits, for delaying output signals of said control signal input circuits;

a plurality of latch circuits, each connected to one of said delay lines and to said system clock signal input circuit, for latching an output signal of a respective one of said logic circuits in synchronization with said system clock signal; and a plurality of logic circuits, each connected to one of said latch circuits, for performing logic operations upon output signals of said latch circuits.

13. A device as set forth in claim 12, wherein a set up time of said control signals with respect to said system clock signal is larger than a delay time of each of said delay lines.

14. A synchronous semiconductor memory device comprising:

a system clock signal input circuit for receiving a system clock signal;

a plurality of control signal input circuits for receiving control signals;

a plurality of logic circuits, connected to said control signal input circuits, for performing logic operations upon output signals of said control signal input circuits;

a plurality of delay lines, each connected to one of said logic circuits, for delaying output signals of said logic circuit; and a plurality of latch circuits, each connected to one of said delay lines and to said system clock signal input circuit, for latching an output signal of a respective one of said delay lines in synchronization with said system clock signal.

15. A device as set forth in claim 14, wherein a set up time of said control signals with respect to said system clock signal is larger than a sum of a delay time of one of said logic circuits and a delay time of one of said delay lines.

16. A synchronous semiconductor memory device comprising:

a system clock signal input circuit for receiving a system clock signal;

a plurality of control signal input circuits for receiving control signals;

a plurality of delay lines, each connected to one of said control signal input circuits, for delaying output signals of said control input circuit, a plurality of logic circuits, connected to said delay lines, for performing logic operations upon output signals of said delay lines; and a plurality of latch circuits, each connected to one of said logic circuits and to said system clock signal input circuit, for latching an output signal of a respective one of said logic circuits in synchronization with said system clock signal.

17. A device as set forth in claim 16, wherein a set up time of said control signals with respect to said clock signal is larger than a sum of a delay time of one of said delay lines and a delay time of one of said logic circuits.

* * * * *

(12) EX PARTE REEXAMINATION CERTIFICATE (6929th)
United States Patent
Obara

(10) Number: US 5,648,931 C1
(45) Certificate Issued: Jul. 14, 2009

(54) HIGH SPEED SYNCHRONOUS LOGIC DATA LATCH APPARATUS

(75) Inventor: Takashi Obara, Tokyo (JP)

(73) Assignee: NEC Electronics Corporation, Nakahara-Ku, Kawasaki, Kanagawa (JP)

Reexamination Request:
No. 90/008,911, Nov. 5, 2007

Reexamination Certificate for:
Patent No.: 5,648,931
Issued: Jul. 15, 1997
Appl. No.: 08/494,998
Filed: Jun. 27, 1995

(30) Foreign Application Priority Data

Jun. 27, 1994 (JP) .............................. 6-165813

(51) Int. Cl.
*H03K 3/00* (2006.01)
*H03K 3/012* (2006.01)
*H03K 3/037* (2006.01)

(52) U.S. Cl. .................... 365/154; 365/194; 365/233.11; 365/233.16; 365/233.17; 365/189.15; 365/189.16; 365/240

(58) Field of Classification Search ................... None
See application file for complete search history.

(56) References Cited

U.S. PATENT DOCUMENTS

| 3,783,254 A | 1/1974 | Eichelberger |
| 5,086,414 A | 2/1992 | Nambu et al. |
| 5,313,501 A | 5/1994 | Thacker |

FOREIGN PATENT DOCUMENTS

| EP | 0 541 840 | 5/1993 |
| EP | 0 548 894 | 6/1993 |
| EP | 0 552 046 | 7/1993 |
| JP | 07-141870 | 6/1995 |

*Primary Examiner*—Matthew Heneghan

(57) ABSTRACT

In a logic data latch apparatus including a clock signal input circuit for receiving a clock signal and at least two logic signal input circuits for receiving logic signals, a logic circuit is connected to the logic signal input circuits so that a logic operation is performed upon the logic signals. An output signal of the logic circuit is latched in a latch circuit in synchronization with the clock signal.

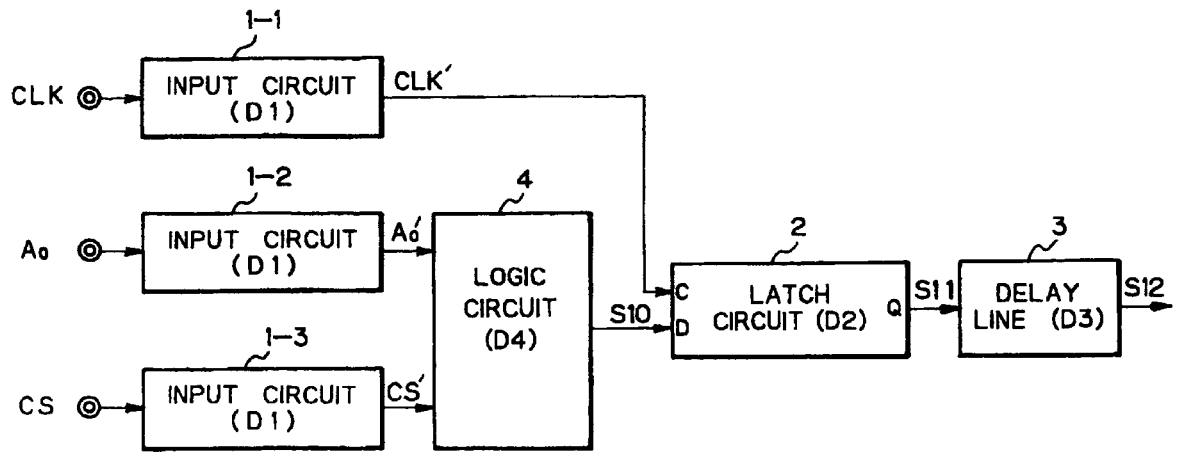

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–10, 12 and 13 are cancelled.
Claims 11 and 14–17 were not reexamined.

\* \* \* \* \*